United States Patent [19]

Watanabe

[11] Patent Number: 4,907,346
[45] Date of Patent: Mar. 13, 1990

[54] TERRESTRIAL MAGNETIC SENSOR
[75] Inventor: Yasuaki Watanabe, Koide, Japan
[73] Assignee: Alps Electric Co., Ltd., Tokyo, Japan
[21] Appl. No.: 129,169
[22] Filed: Dec. 7, 1987
[30] Foreign Application Priority Data Mar. 10, 1987 [JP] Japan .............................. 62-35500[U]

[51] Int. Cl.⁴ ............................................. G01C 17/28
[52] U.S. Cl. ...................................... 33/361; 324/253; 335/304
[58] Field of Search ................. 33/361, 362, 345, 350; 335/302, 303, 304, 299; 324/253, 254, 255, 260; 106/287.1

[56] References Cited

U.S. PATENT DOCUMENTS

| | | | |
|---|---|---|---|
| 2,432,514 | 12/1947 | Depp et al. | 33/361 |
| 2,606,229 | 8/1952 | Brewer et al. | 33/361 |
| 3,421,074 | 1/1969 | Geyger | 324/254 |
| 3,835,375 | 9/1974 | Rovner | 33/361 |
| 4,023,278 | 5/1977 | Hoyt | 33/377 |
| 4,398,352 | 8/1983 | Maine | 33/361 |
| 4,616,424 | 10/1986 | Arakawa et al. | 33/361 |
| 4,626,782 | 12/1986 | Lewis | 33/361 |
| 4,644,313 | 2/1987 | Miyajima | 335/304 |
| 4,677,381 | 6/1987 | Geerlings | 33/361 |
| 4,763,072 | 8/1988 | Katoh et al. | 33/361 |

FOREIGN PATENT DOCUMENTS 831637  1/1970  Canada .................................. 33/361

Primary Examiner—William A. Cuchlinski, Jr.
Assistant Examiner—Patrick R. Scanlon
Attorney, Agent, or Firm—Guy W. Shoup; Paul J. Winters; Gideon Gimlan

[57] ABSTRACT

A terrestrial magnetic sensor has a bobbin body having a magnetic core inserting groove, a silicon gel filled in the magnetic core inserting groove, a magnetic core buried in the silicon gel filled in the magnetic core inserting groove, and a bobbin cover for closing the magnetic core inserting groove of the bobbin body. Thus, this terrestrial magnetic sensor can suppress the decrease in the magnetic permeability by burying a magnetic core in a silicon gel and can be hardly affected by the influences of the variations in an environmental temperature and an external stress.

8 Claims, 2 Drawing Sheets

TERRESTRIAL MAGNETIC SENSOR

BACKGROUND OF THE INVENTION

1. Field of the Invention

This invention relates to a terrestrial magnetic sensor and, more particularly, to a terrestrial magnetic sensor for detecting a terrestrial magnetism with a simple structure.

2. Description of the Prior Art

Heretofore, in a terrestrial magnetic sensor of this type, a magnetic core has been fixed with resin or the like.

Since the magnetic core has been fixed with resin or the like in the above-mentioned conventional terrestrial magnetic sensor, the sensor has a drawback that its magnetic permeability decreases to 50% or less of the initial magnetic permeability.

There is another drawback that the magnetic permeability of the magnetic core is affected by the influence of the variations in an environmental temperature.

Further, the conventional sensor has still another drawback that the magnetic core is affected by the influence of an external stress.

SUMMARY OF THE INVENTION

Accordingly, an object of this invention is to provide a terrestrial magnetic sensor which can overcome the above-mentioned drawbacks and which can suppress the decrease in the magnetic permeability by burying a magnetic core in a silicon gel and can be hardly affected by the influences of the variations in an environmental temperature and an external stress.

The terrestrial magnetic sensor of the present invention comprises a bobbin body having a magnetic core inserting groove, a silicon gel filled in the magnetic core inserting groove, a magnetic core buried in the silicon gel filled in the magnetic core inserting groove, and a bobbin cover for closing the magnetic core inserting groove of the bobbin body.

(Operation)

In the terrestrial magnetic sensor of this invention, the bobbin body has the magnetic core inserting groove, the silicon gel is filled in the magnetic core inserting groove, the magnetic core is buried in the silicon gel filled in the magnetic core inserting groove, and the bobbin cover is closed on the magnetic core inserting groove of the bobbin body.

The above and other related objects and features of the invention will be apparent from a reading of the following description of the disclosure found in the accompanying drawings and the novelty thereof pointed out in the appended claims.

DESCRIPTION OF THE PREFERRED EMBODIMENTS

An embodiment of a terrestrial magnetic sensor according to the present invention will be described in detail with reference to the accompanying drawings.

Figure 1:
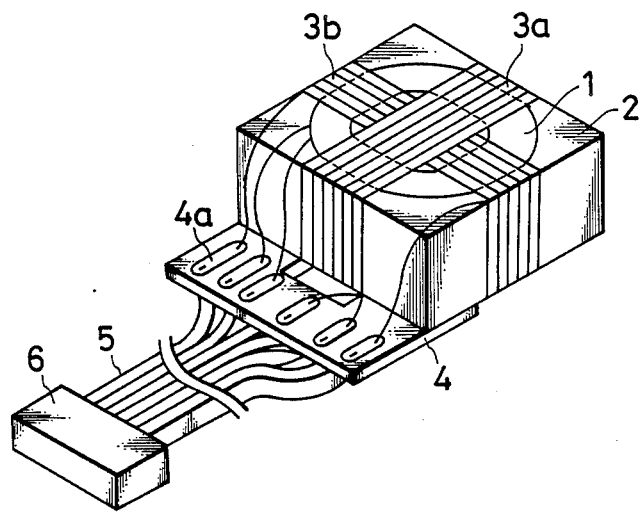
FIG. 1 is a perspective view showing an embodiment of a terrestrial magnetic sensor according to the present invention.
Figure 2:
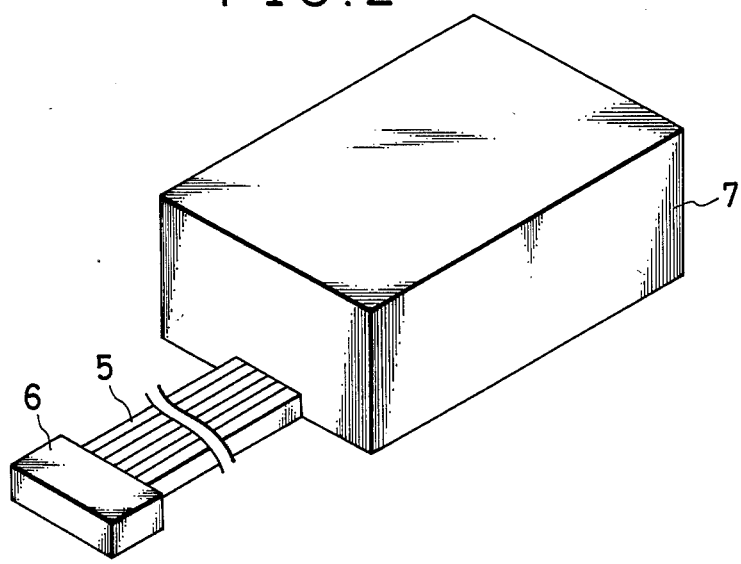
FIG. 2 is a perspective view showing the state that the terrestrial magnetic sensor of the invention is contained in a housing base.

FIG. 1 is a perspective view showing an embodiment of a terrestrial magnetic sensor according to the present invention. The terrestrial magnetic sensor of this embodiment mainly comprises a toroidal coil 1, a holding case 2 for containing the toroidal coil 1 and formed with a groove (not shown) for windings 3a and 3b for detecting a magnetism, windings 3a, 3b wound perpendicularly to each other on the holding case 2 for detecting a magnetism, a printed substrate 4 fixed to the holding case 2, leads 5 connected at its one end with the printed substrate 4, a connector 6 connected with the other ends of the leads 5, and a housing base 7 (in FIG. 2) for containing the holding case 2.

Figure 3:
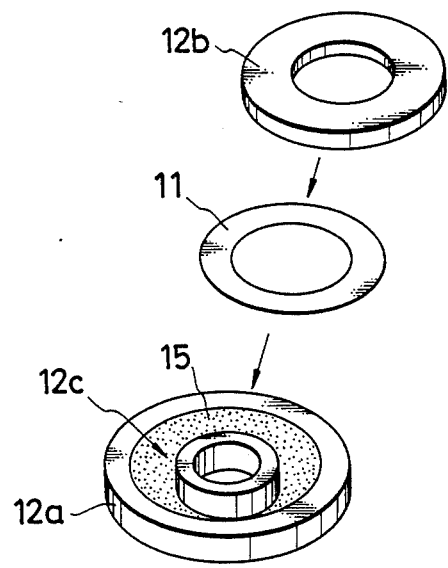
FIG. 3 is an exploded perspective view showing the construction of a toroidal coil in FIG. 1.
Figure 4:
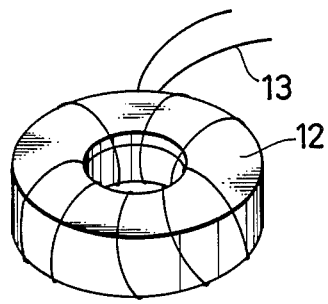
FIG. 4 is a perspective view showing the external appearance of the toroidal coil in FIG. 1.

The toroidal coil 1 comprises, as shown in FIGS. 3 and 4, a magnetic core 11 formed in a ring shape by a Permalloy or the like, a ring-shaped bobbin 12 made of a bobbin body 12a and a bobbin cover 12b for containing the magnetic core 11, and a coil 13 wound in a toroidal shape on the bobbin 12. A magnetic core inserting groove 12c is formed on the bobbin body 12a to insert the magnetic core 11, and silicon gel 15 is filled in the magnetic core inserting groove 12c.

Then, a method for manufacturing the terrestrial magnetic sensor of this embodiment will be described.

The silicon gel 15 is first filled in the magnetic core inserting groove 12c of the bobbin body 12a, the magnetic core 11 is then inserted into the magnetic core inserting groove 12c, and the silicon gel 15 is then filled. The bobbin cover 12b is so engaged to be bonded to the bobbin body 12a to cover the magnetic core inserting groove 12c. The coil 13 is then wound in a toroidal shape on the bobbin 12 to form the toroidal coil 1.

Then, the toroidal coil 1 is inserted into the holding case 2. Resin is filled in a gap between the inserted toroidal coil 1 and the holding case 2. After the resin is dried, the windings 3a and 3b for detecting magnetism are so wound as to be perpendicular to each other along the groove of the holding case 2.

Then, the printed substrate 4 is bonded to the holding case 2, and the toroidal coil 1 and the both ends of the windings 3a and 3b for detecting magnetism are respectively soldered to the ends of 6 terminals 4a of the printed substrate 4. One ends of the leads 5 are soldered to the other ends of the terminal 4a to connect the other ends of the leads 5 to the connector 6. Then, the connector 6 is connected to the drive detector (not shown) of the terrestrial magnetic sensor.

Subsequently, the terrestrial magnetic sensor is contained in the housing base 7 made of the body and the cover to protect it against external dusts.

In the terrestrial magnetic sensor of this embodiment, when an AC excitation signal is applied to the toroidal coil 1, the second harmonic waves of the AC excitation signal are generated in the toroidal coil 1 in response to the magnetic field generated by the signal and the external magnetic field, and the second harmonic waves are generated by the windings 3a and 3b perpendicularly crossed to each other for detecting the magnetism. The external magnetic field is detected by the second harmonic waves.

According to the present invention as described above, the silicon gel is filled in the magnetic core inserting groove of the bobbin body to bury the magnetic core in the silicon gel. Thus, the decrease in the magnetic permeability of the magnetic core can be suppressed as compared with the case that the resin is used.

Further, since the silicon gel encloses the magnetic core in the gel state, the magnetic permeability of the magnetic core is hardly affected by the influence of the environmental temperature.

Moreover, since the silicon gel has fluidity, the magnetic core is hardly affected by the influence of the external stress.

What is claimed is:

1. A terrestrial magnetic sensor comprising:
   a bobbin body having a magnetic core inserting groove,
   a silicon gel filled in the magnetic core inserting groove,
   a magnetic core buried in the silicon gel filled in the magnetic core inserting groove, and
   a bobbin cover for closing the magnetic core inserting groove of the bobbin body.

2. A terrestrial magnetic sensor according to claim 1, wherein said magnetic core is formed in a ring shape and composed of a Permalloy, and wherein said bobbin body and bobbin cover are correspondingly ring-shaped such that their combination defines a toroidal bobbin containing said magnetic core, said terrestrial magnetic sensor further comprising a coil wound in a toroidal shape about said toroidal bobbin.

3. A method for manufacturing a terrestrial magnetic sensor as claimed in claim 1 comprising the steps of:
   defining the shapes of the bobbin body and bobbin cover such that their combination results in a toroidal bobbin,
   filling said magnetic core inserting groove of said bobbin body partially with said silicon gel,
   then inserting said magnetic core into said partially filled magnetic core inserting groove,
   then further filling said magnetic core inserting groove with said silicon gel such that said core is buried in said silicon gel,
   engaging said bobbin cover to said bobbin body to cover said magnetic core inserting groove and form said toroidal bobbin, and
   then winding a coil in a toroidal shape about the toroidal bobbin to form a toroidal coil.

4. A method for manufacturing a terrestrial magnetic sensor as claimed in claim 3, further comprising the steps of:
   inserting said toroidal coil into a holding case, leaving a gap between said toroidal coil and said holding case,
   filling said gap with resin,
   then drying the resin,
   providing first and second windings about said holding case for detecting magnetism, the first and second windings being perpendicular to each other,
   then bonding a printed substrate having terminals to said holding case, and
   coupling wires of said toroidal coil and said first and second windings to the terminals of said printed substrate.

5. A magnetic detector comprising:
   a toroidal bobbin having a toroidal chamber defined therein, the toroidal chamber being filled with a heat insulating gel;
   a ring-shaped magnetic core enclosed in said chamber and encased in said gel so as to be substantially insulated from the influences of environmental temperature; and
   a coil wound about the toroidal bobbin for magnetically exciting the magnetic core.

6. The magnetic detector of claim 5 wherein the heat insulating gel comprises a silicon gel.

7. The magnetic detector of claim 6 wherein the magnetic core is composed of a permalloy.

8. The magnetic detector of claim 5 wherein the gel has a fluidity which substantially insulates said magnetic core from the influence of external stress.

* * * * *